(12) United States Patent
Herzog (10) Patent No.: US 7,661,544 B2
(45) Date of Patent: Feb. 16, 2010

(54) SEMICONDUCTOR WAFER BOAT FOR BATCH PROCESSING

(75) Inventor: Frank Herzog, Niederau (DE)

(73) Assignee: Tokyo Electron Limited, Tokyo (JP)

( * ) Notice: Subject to any disclaimer, the term of this patent is extended or adjusted under 35 U.S.C. 154(b) by 108 days.

(21) Appl. No.: 11/670,111

(22) Filed: Feb. 1, 2007

(65) Prior Publication Data

US 2008/0185308 A1    Aug. 7, 2008

(51) Int. Cl.
    *A47G 19/08*    (2006.01)
(52) U.S. Cl. .................................. 211/41.18
(58) Field of Classification Search .............. 211/40, 211/41.18; 206/307.1, 454, 832, 710; 414/935
    See application file for complete search history.

(56) References Cited

U.S. PATENT DOCUMENTS

| | | | | |
|---|---|---|---|---|
| 4,707,247 A | * | 11/1987 | Savoy | 206/307.1 |
| 4,727,993 A | * | 3/1988 | Mirkovich et al. | 211/41.18 |
| 4,802,842 A | | 2/1989 | Hirayama | |
| 4,950,870 A | | 8/1990 | Mitsuhashi et al. | |
| 5,162,047 A | | 11/1992 | Wada et al. | |
| 5,310,339 A | | 5/1994 | Ushikawa | |
| 5,431,561 A | | 7/1995 | Yamabe et al. | |
| 5,458,688 A | | 10/1995 | Watanabe | |
| 5,534,074 A | | 7/1996 | Koons | |
| 5,562,387 A | | 10/1996 | Ishii et al. | |
| 5,577,621 A | * | 11/1996 | Yi | 211/41.18 |
| 5,586,880 A | | 12/1996 | Ohsawa | |
| 5,626,456 A | | 5/1997 | Nishi | |
| 5,775,889 A | | 7/1998 | Kobayashi et al. | |
| 5,813,851 A | | 9/1998 | Nakao | |
| 5,820,367 A | | 10/1998 | Osawa | |

(Continued)

FOREIGN PATENT DOCUMENTS

JP            04006826 A        1/1992

(Continued)

OTHER PUBLICATIONS

EPO, International Search Report and Written Opinion of the International Searching Authority, International Application No. PCT/US2008/052760, Mailed Jun. 3, 2008, 12 pages.

*Primary Examiner*—Jennifer E. Novosad
(74) *Attorney, Agent, or Firm*—Wood, Herron & Evans, L.L.P.

(57) ABSTRACT

A boat is provided for stacking semiconductor wafers vertically in processes in which low friction deposits may coat wafer supporting surfaces. In carbon processes, for example, low friction coatings can form that allow the wafers to slip sideways in the boat, leaving them sufficiently out of alignment to cause wafer breakage in handling. Typical boats for these processes having vertical legs, typically three or four in number, in which aligned notches support each of the wafers. The slots provide enough clearance around the edge of the wafer to facilitate loading and unloading of the wafers without wafer damage, as long as the wafers remain centered. For low friction process environments, each notch is provided with a shallow recess on which the edge of a wafer can rest. The recess adds a low step close to the wafer edge that resists horizontal sliding movement of the wafer. Wafers are loaded by inserting them into the boat in a plane spaced above the steps, then lowered onto the recesses.

11 Claims, 4 Drawing Sheets

U.S. PATENT DOCUMENTS

| | | |
|---|---|---|
| 5,865,321 A | 2/1999 | Tomanovich |
| 5,897,311 A | 4/1999 | Nishi |
| 6,059,123 A * | 5/2000 | Cotutsca .................. 211/40 |
| 6,095,806 A | 8/2000 | Suzuki et al. |
| 6,099,302 A * | 8/2000 | Hong et al. ............ 432/259 |
| 6,186,344 B1 * | 2/2001 | Park et al. ............ 211/41.1 |
| 6,344,387 B1 | 2/2002 | Hasebe et al. |
| 6,523,701 B1 * | 2/2003 | Yoshida et al. ........ 211/41.18 |
| 6,634,882 B2 | 10/2003 | Goodman |
| 2002/0113027 A1 * | 8/2002 | Minami et al. ........ 211/41.18 |
| 2003/0157453 A1 | 8/2003 | Irie et al. |
| 2005/0023231 A1 * | 2/2005 | Huang et al. .......... 211/41.18 |
| 2005/0205502 A1 * | 9/2005 | Brown et al. .......... 211/41.18 |
| 2006/0226094 A1 * | 10/2006 | Cho et al. ............ 211/41.18 |
| 2007/0006803 A1 | 1/2007 | Cadwell et al. |
| 2007/0068882 A1 * | 3/2007 | Yoshizawa ............ 211/41.18 |
| 2007/0125726 A1 * | 6/2007 | Seo .................... 211/41.18 |
| 2007/0297876 A1 * | 12/2007 | Sasajima et al. .......... 414/160 |

FOREIGN PATENT DOCUMENTS

| | | |
|---|---|---|
| JP | 05291166 A | 11/1993 |
| JP | 6168903 | 6/1994 |
| JP | 6260438 | 9/1994 |
| JP | 9199437 | 7/1997 |
| JP | 9199438 | 7/1997 |
| JP | 1050626 | 2/1998 |
| JP | 11003866 A | 1/1999 |
| JP | 2000100739 A | 4/2000 |

* cited by examiner

SEMICONDUCTOR WAFER BOAT FOR BATCH PROCESSING

This invention relates to batch processing of semiconductor wafers and similar substrates, and more particularly to carbon deposition processing and other processes in which low friction materials deposit on surfaces within a wafer processing chamber.

BACKGROUND OF THE INVENTION

Semiconductor wafer processes commonly involve the exposure of surfaces of the wafers to processing gas in a processing chamber. Many of these processes treat the wafers in batch processes that simultaneously expose a plurality of wafers to the processing gas. In many typical batch treatment processes, the wafers are carried in boats that support the wafers in an array in which they are arranged in parallel rack-like structure. These boats include those in which horizontally oriented wafers are spaced in a vertical stack. A common boat may be formed of a set of parallel vertical rods having slots or notches evenly spaced along each of the rods. These notches are arranged in mutual alignment with the notches on the other rods to define a stack of shelves on which the wafers are robotically placed for processing. The spacing between the slots maintains the wafers at a sufficient distance from each other so that the wafers can be simultaneously exposed to a process gas.

Figure 1:
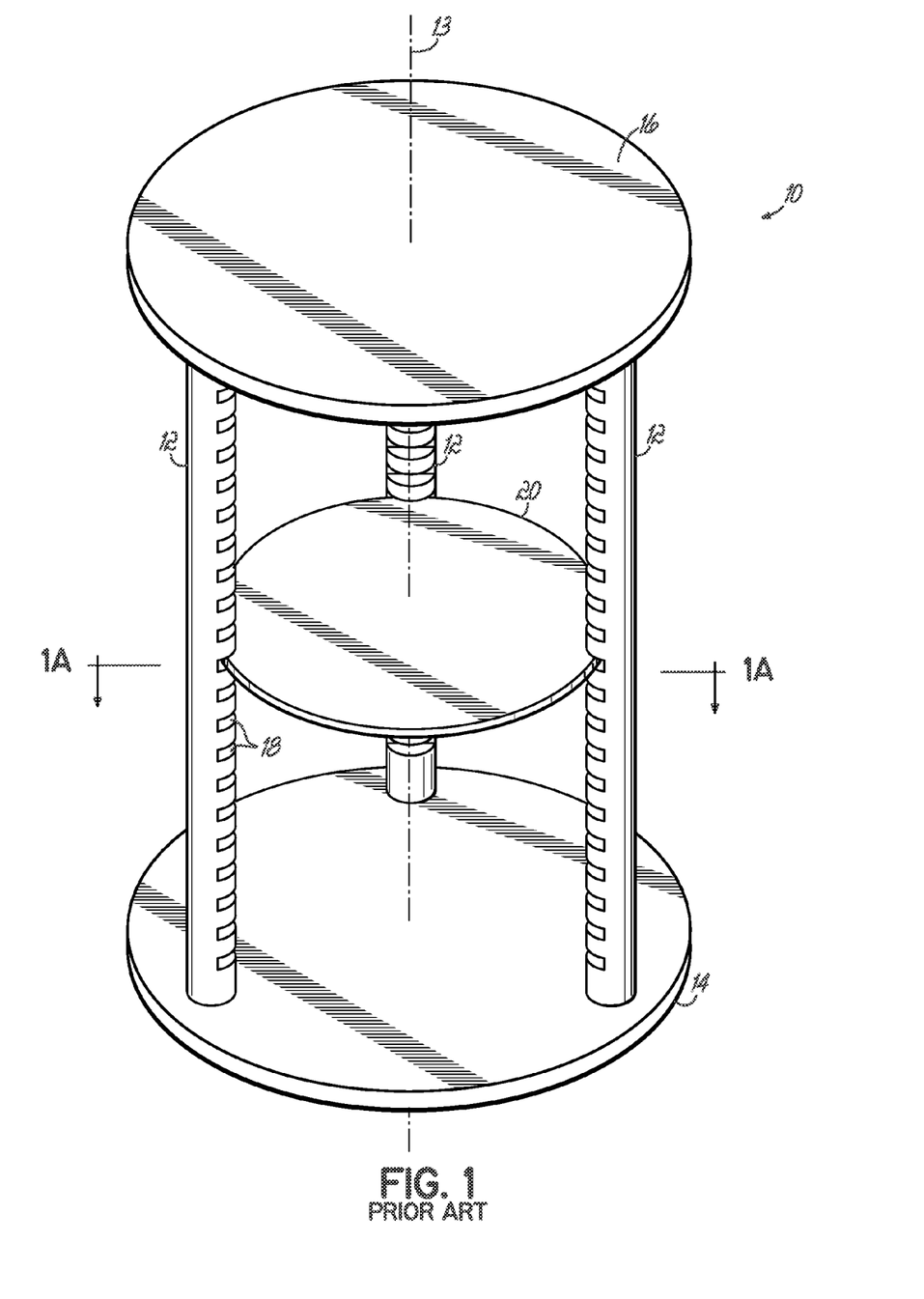
FIG. 1 is a simplified diagram of one prior art embodiment of a vertical boat used to support wafers for batch processing.

FIG. 1 is a simplified diagrammatic representation of a conventional boat 10 according to the prior art. The boat 10 includes a plurality of parallel vertical support members, for example, rods or legs 12, typically three or four in number, that are equally spaced from a central vertical axis 13 and vertically extend between a base 14 and a top plate 16. Alternatively, the base 14 and the top plate 16 may be ring-shaped. A plurality of slots or notches 18 is provided in each of the rods 12, mutually aligned with notches of the other rods and facing inwardly toward the central axis 13. As shown in FIG. 1, a plurality of wafers 20, only one of which is shown for simplicity, is supported horizontally in the slots 18 of rods 12 with their centers aligned on the central axis 13. In some applications, each wafer is first placed in a removable ring-shaped susceptor, which is supported in the notches, particularly in applications in which wafer temperature uniformity is critical. However, such susceptors increase handling and decrease throughput, so that direct support of the wafers in notches on the support members is often preferable.

Figure 1A:
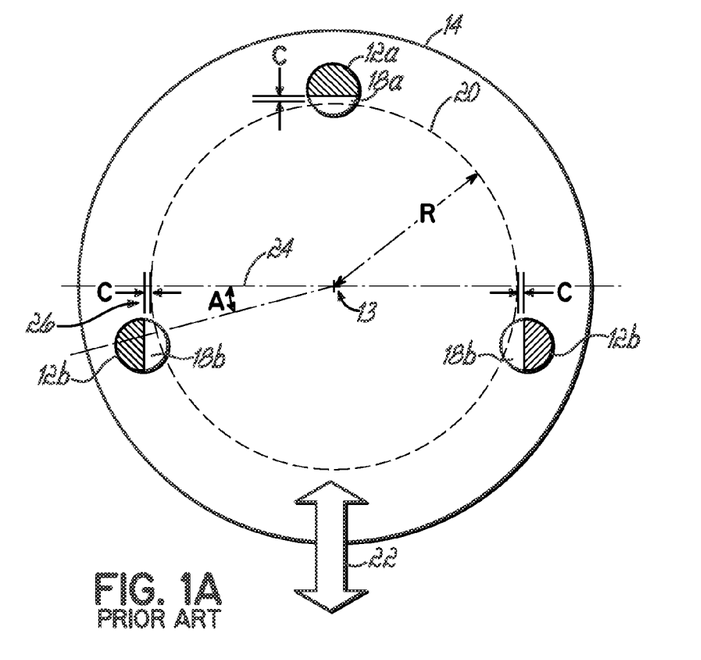
FIG. 1A is a horizontal cross-sectional view along the line A-A of FIG. 1.

FIG. 1A is a cross-section through the boat 10 through one of the notches 18 in the legs 12, looking down from immediately above the wafer 20. It shows a wafer 20 of radius R, where R equals 100 millimeters (mm), 150 mm, or 225 mm, for example. The depths of the notches can be defined by a radius from the central axis 13 of the boat 10 to exceed the radius of the wafers 20 by about 5 mm or more, for example, providing a clearance C from the edge of the wafer 20 that is enough to insure that wafer 20 does not contact the legs 12 when being placed in or removed from the boat 10. This clearance C can be seen in the legs 12a and 12b of the three-legged boat 10.

Wafers 20, when in the boat 10, rest on the upwardly-facing bottom surfaces of the notches 18, thereby being supported at three areas around the perimeter of the wafer 20 (four areas for four-legged boats). Wafers 20 are inserted into and removed from the boat 10 from a front side of the boat 10, in the direction represented by the arrow 22, toward and away from the back leg 12a. Friction between the backsides of the wafers 20 and the upwardly-facing bottom surfaces of the notches 18 hold the wafers 20 in place during processing and while the boat 10 is being moved into or out of a reactor chamber.

Front legs 12b are positioned to the sides of the boat 10 to provide an opening at the front of the boat 10 that is larger than the diameter of the wafers 20, preferably allowing clearance C at both sides of the wafer 20. These front legs 12b support the wafers 20 forward of the center of gravity of the wafers 20. For example, the front legs 12b may be spaced at an angle A from a transverse centerline 24 of the wafers 20, through the center axis 13. This angle A may be, for example, 12.5 degrees, with the front legs 12b spaced an angle of 180-2A apart, or 155 degrees, for example. To provide the clearance C, the back wall of the slots 18b lie in a plane 26 that is spaced the distance C from the edge of wafers 20 at their transverse centerline 24. The slot 18a in the back leg 12a is parallel to a tangent to the edge of the wafer 20.

Figure 2:
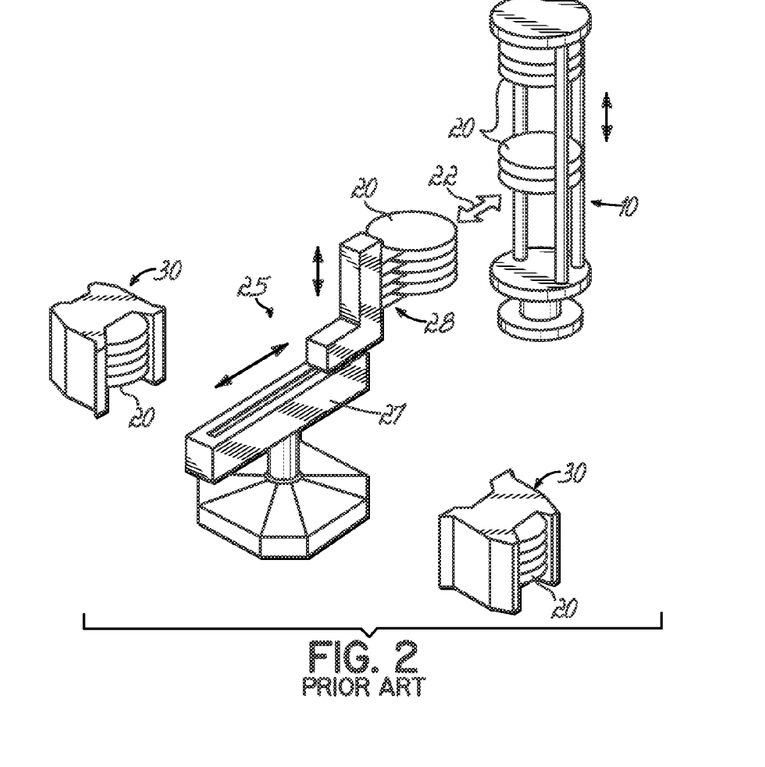
FIG. 2 is a perspective diagram showing a wafer transfer arm for loading and unloading wafers to and from a boat of FIGS. 1 and 1A, according to the prior art.

Wafers 20 are moved into and out of the boat 10 in groups of, for example, five wafers 20, as illustrated in FIG. 2. This loading and unloading of the boat 10 is carried out with a transfer robot 25 having a rotatable and extendable transfer arm 27 that is provided with a corresponding group of, for example five, end effectors 28, which move wafers 20 into and out of the boat 10 in the direction of the arrow 22. The transfer robot 25 typically transfers wafers 20 between the boat 10 and cassettes 30. To load and unload wafers 20 to and from all notches 18 of the boat 10, the transfer arm 27 of the transfer robot 25 may be vertically moveable, or the boat may be vertically moveable, or both, so that the end effectors 28 can align with any of the notches 18.

The above described boats 10 and transfer robots 25 are used for many processes. Depending on the process, the boats 10 can be coated with any of a number of substances. Carbon batch processes, for example, can be carried out on pluralities of wafers 20 held in a boat 10. In such carbon processes, carbon, often in the form of graphite, can coat the surfaces of the legs 12, including those of the notches 18. This carbon can act as a lubricant, reducing greatly the friction between the backsides of the wafers 20 and the upwardly-facing bottom surfaces of the notches 18. This lubrication allows wafers 20 to be moved transversely in the boats 10 at various stages of handling and processing. This movement, or wafer slippage, mis-aligns the wafers 20 such that, when picked up by a transfer arm 27, a wafer 20 can strike one of the legs 12, which can cause the wafer to break or will allow the wafer to slide out of the boat before transfer, which is highly undesirable and costly.

One solution to the problem of wafer slippage in a carbon process or other such process where such slippage tends to occur is to frequently clean the boat, even after each batch of wafers 20 is processed. This solution, while tolerable in a research or laboratory environment, impacts throughput in a commercial or production setting, which is excessively costly.

Accordingly, there is a need to solve the wafer slippage problem in batch processing boats in carbon processes and other processes where friction on wafer supporting surfaces declines during processing.

SUMMARY OF THE INVENTION

An objective of the present invention is to reduce the effects of slippage of wafers stacked in a boat in a batch process. A more particular objective of the invention is to prevent wafers stacked vertically in a boat to move from a centered position as a result of a reduction in friction due to material deposited on the wafer supporting surfaces by the process.

According to principles of the present invention, the wafer supporting surfaces of a wafer boat are recessed in their areas of contact with the wafers so that the wafers rest below the upper surfaces of the wafer supports. An ascending slope or vertical step forms a transition region on the support surfaces at each set of boat slots. The transition region surrounds the perimeter of a wafer that is resting on the recessed areas and provides a stop in as close proximity to the edge of a centered wafer as practical so as to prevent the edge of the wafer from sliding outwardly more than a tolerable amount either toward the supports or towards the spaces between the supports.

In the illustrated embodiment of the invention, the slots of the boat are formed by horizontally aligned notches in each of a plurality of vertical support rods, typically three or four in number, that surround a central vertical axis of the boat. The slots between two of the rods at the front of the boat provide clearance for a wafer to be inserted between them. The clearance is typically equal to the diameter of the wafers plus at least about 4 millimeters (mm). Stops formed by the transition areas or steps in the upper support surfaces of the notches in support members toward the front of the boat are typically at a radius from the central vertical axis that is larger than that of the wafer, preferably by about 1 mm. A robot arm is capable of centering the wafer within the perimeter of the step. The depth of the recesses in the support surfaces is preferably less than the thickness of a wafer.

Loading wafers onto a boat having the features of the present invention involves inserting a wafer into a boat slot above a wafer support surface. Wafers that are inserted by a robot arm between the notches in the spaced front rods into the boat, are moved until their centers are in approximate alignment with the central vertical axis, preferably within less than 1 mm thereof. When so aligned, the wafer is lowered onto the recessed contact areas of the supports, within the stop formed by the transition area or step, centered within the perimeter of the step. Once the wafer is so positioned in the slots, the wafer cannot slide off the boat since the steps act as a mechanical stopper, and cannot slide off-center by more than the clearance between the step and the wafer's edge. After processing, the wafer is raised above the slots by the robot and removed from the boat. The wafer cannot be removed from the boat unless it is first raised above the slots, which act as mechanical stoppers.

These and other objectives and advantages of the present invention will be more readily apparent from the following detailed description.

DETAILED DESCRIPTION

Figure 3:
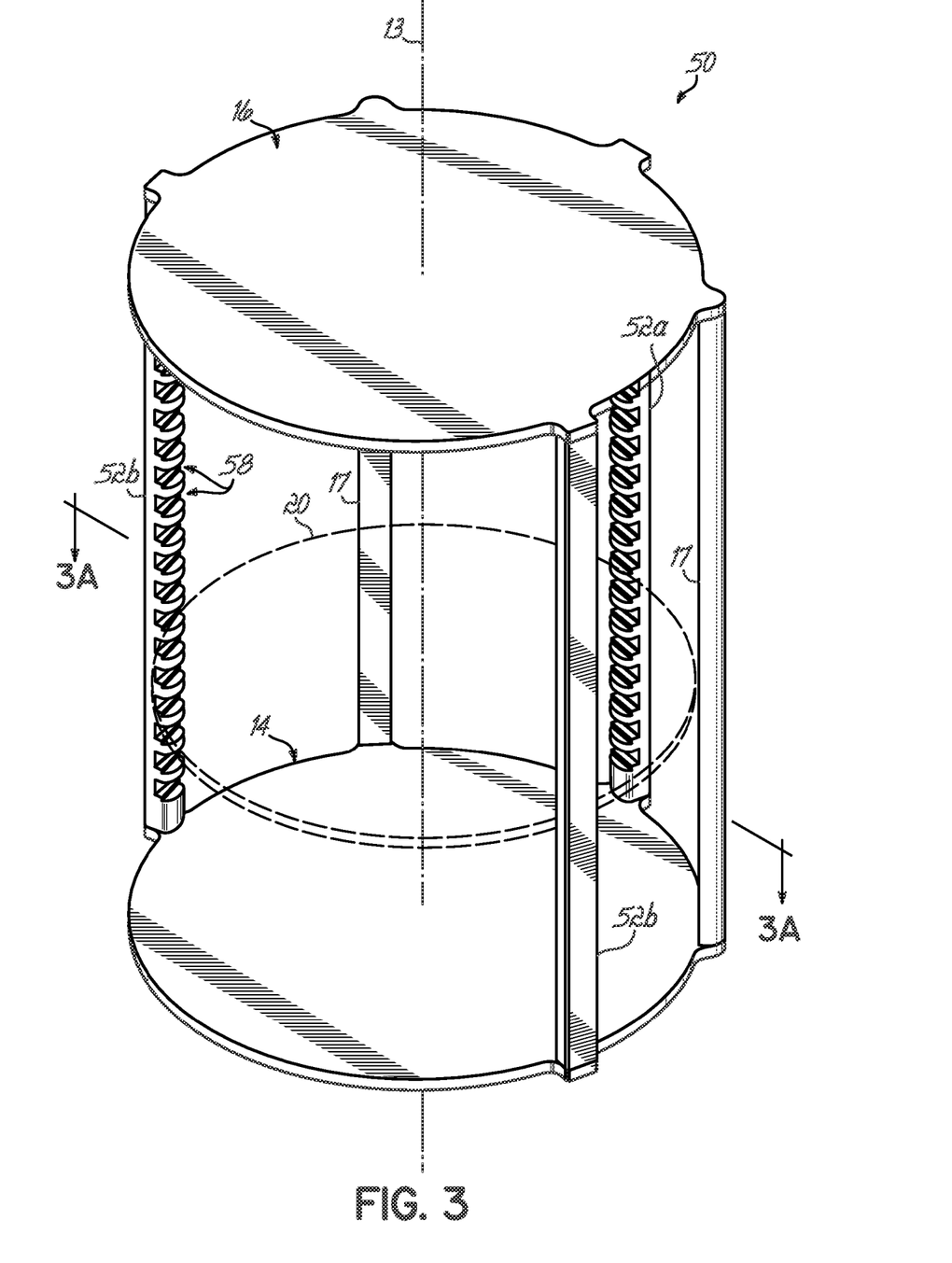
FIG. 3 is a perspective diagram of a vertical supporting boat according to one embodiment of the present invention.

One embodiment of the present invention is illustrated in FIG. 3, which is representation of a boat 50 that has many details similar to that of boat 10 of FIG. 1. For example, the boat 50 includes a plurality of parallel vertical support members 52, which can be three or more in number, that are equally spaced from central vertical axis 13 and extend between base 14 and top plate 16. Further, a plurality of notches or slots 58 is provided in each of the vertical support members 52, mutually aligned with notches of the other members 52 and facing generally inwardly toward the central axis 13. Additional vertical structural members 17 without slots may also be provided to stiffen the boat 50.

Figure 3A:
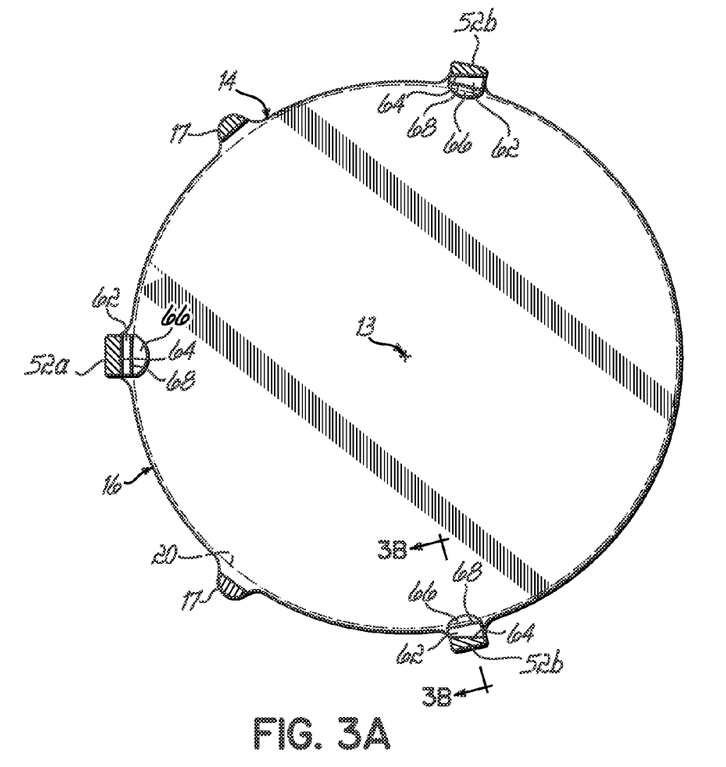
FIG. 3A is a horizontal cross-sectional view, similar to FIG. 1A, along the line A-A of FIG. 3 through the vertical members of the boat.

As is shown in FIG. 3 and FIG. 3A, a plurality of wafers 20 are supported horizontally in the slots 58 of the members 52 with their centers aligned on the central axis 13. The members 52 include one or more rearward members 52a at the back of the boat, and two forward members 52b on the sides of the boat slightly spaced toward the front of the boat. The slots 58, which face generally inwardly toward the axis 13, have vertical outer surfaces 64, better seen in FIG. 3B, that are spaced sufficiently far from the axis 13 to provide sufficient clearance around the edge of the wafers 20 so that the wafers 20 do not contact the surfaces 64 on the members 52b during loading or unloading by a transfer arm. This clearance, typically 5 to 10 mm or more from the edge of a wafer 20, allows too much space for motion of the wafers 20 in the event that they were to slide horizontally during processing the wafers or handling of the boat 50.

Figure 3B:
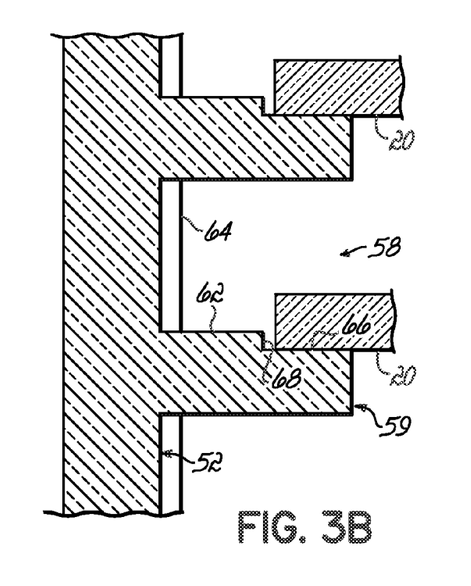
FIG. 3B is a vertical cross-sectional view along line B-B of FIG. 3A through the slots of the vertical members.

In a typical boat 50, the slots 58 are formed in the members 52 spaced on centers about 8.7 mm apart, with the slots 58 being about 5.7 mm high and cut or otherwise machined into the members 52, as illustrated in FIG. 3B. This leaves shelf-like supports 59 between the slots 58 of about 3 mm in the members 52 to support the wafers 20. The recesses 66 are cut into the upwardly facing surfaces 62 of these supports 59.

To prevent this sliding of the wafers, the present invention provides recesses 66 in the upwardly facing surfaces 62 of the notches 58 on which the edges of the wafers 20 can rest. The recesses 66 underlie the edges of the wafers 20, when they are centered on the axis 13, and extend beyond the edges only a small amount, for example approximately 1 mm+/−0.1 mm, terminating at the outer extent of the recesses 66 in a vertical or otherwise raised step 68, at least on the forward members 52b. On rearward members 52a, the steps may be spaced farther from the edge of the wafer, for example, 3 mm+/−0.5 mm, to allow extra tolerance for the robot arm in placing the wafers in the boat. The steps 68 extend from horizontal planes that contain the recesses 66 to horizontal planes that contain the remainder of the surfaces 62, as illustrated in FIG. 3B.

The height of the steps 68 above the recesses 66 should be enough to stop movement of the edge of a wafer 20 beyond the step, and may be, for example, about one-half the thickness of the wafer 20, or about half a millimeter. The height of the steps 68 above the recesses 66 should also be less than the thickness of the wafer 20 high for most processes so as not to affect the uniformity of the process near the edge of the wafer near the notches 58. The steps 66 confine the wafer 20 to movement horizontally of less than 5 mm from the centered positions of the wafers 20.

Each of the notches or slots 58 has a horizontal lower surface 62 which faces upwardly to support the edge of a wafer 20 that is supported on at least three such surfaces of a set of notches 58 in each of a plurality of three or more of the vertical members 52, spaced less than 180 degrees apart so that wafers 20 can be balanced thereon with the areas of support surrounding the center of gravity of the wafers 20, when the wafer 20 is aligned on the axis 13. The members 52 are each made of an integral piece of material having adequate structural properties to reliably support a vertical stack of the wafers 20 while maintaining compatibility with the process. A typical material for the members 52 is quartz.

The recesses 66 are cut into the integral material of the members 52 to form the steps 68. After machining, the members 52 are treated, for example by flame polishing, to remove burrs and sharp edges that could contribute to abrasion and particle generation.

In loading wafers 20 onto the boat 50, a group of typically five wafers 20 at a time are moved into the boat 50 by the robot arm 27 of the transfer robot 25, with the edges of the wafers 20 passing between the forward members 52b in line with the approximate vertical centers of the slots 58, while maintaining clearance from the surfaces 64 of the slots 58. When the centers of the wafers 20 are aligned with the vertical axis 13 of the boat 50, within a fraction of a millimeter of the center, the wafers 20 are then lowered by the robot arm 27 they rest at their edges on the recesses 66 of a horizontally aligned set of the notches 58 in each of the members 52a and 52b. When the wafers 20 are moved vertically downward, they are sufficiently centered on the axis 13 so that their edges clear the steps 68 of the members 52 approximately equally. Once the wafers 20 are placed in the boat 50, the robot arm 27 is lowered and withdrawn from the boat 50.

During processing, in for example a carbon process, deposits of a low friction material, for example graphite, may cover the members 52, including the supporting surfaces 62 along with the exposed parts of the recesses 66, enabling the wafers 20 to slide horizontally in the notches 58. If they do so slide, the steps 68 limit their horizontal motion and confine the wafers 20 sufficiently on center in the boat 50 to substantially reduce the likelihood that misalignment of the wafers 20 will result in damage during handling.

Removal of the wafers 20 from the boat 50 involves extension of the end effectors 28 of the robot arm 27 between a group of wafers 20, then raising the wafers 20 from the recesses 66 to a position above the steps 68 and above the plane of the notch surfaces 62 so that they are centered in the slots 58, an upward movement of about 3 mm. The arm 27 is then retracted from the boat 50 to move the wafers 20 between the forward members 52b.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. A boat for supporting a plurality of semiconductor wafers, all of the same radius R, in a vertical stack for processing, where R equals one and only one of either 100 millimeters (mm), 150 mm, or 225 mm, the boat comprising:
a plurality of vertical support members spaced around a vertical axis and each having a plurality of vertically spaced slots therein each horizontally aligned with a slot in each of the other vertical support members;
each slot having an upwardly facing surface therein having a recessed wafer supporting area thereon recessed below the upwardly facing surface and forming an inwardly facing vertical step in the upwardly facing surface, the vertical steps each facing the vertical axis and being spaced at least a distance R+1 mm from the vertical axis, wherein the steps are sufficiently close to the vertical axis to be effective to constrain wafers having a radius R supported on the recessed wafer supporting areas from sliding off of a wafer supporting area within one of the horizontally aligned slots in one of the other vertical support members;
the plurality of vertical support members including at least three vertical members, adjacent ones of which are spaced less than 180 degrees apart around the vertical axis;
two adjacent ones of the vertical support members being spaced forward of the vertical axis and spaced sufficiently apart, and having the slots therein extending to a distance of at least R+5 mm from the vertical axis, to allow sufficient horizontal clearance between said two adjacent ones of the vertical support members for wafers of radius R to be loaded onto, and removed from, the boat without contacting said two adjacent ones of the vertical support members, while the steps on said two adjacent ones of the vertical support members are insufficiently spaced to allow wafers to be loaded or unloaded between the steps without being raised above the steps; and
at least one of the vertical support members being spaced rearward of the vertical axis.

2. The boat of claim 1 wherein:
the vertical steps on the upwardly facing surfaces of each of the slots in said two adjacent ones of the vertical support members are spaced outwardly approximately 1 mm from the perimeters of wafers centered on the vertical axis.

3. The boat of claim 2 wherein:
the vertical steps on the upwardly facing surfaces of each of the slots in said two adjacent ones of the vertical support members are spaced outwardly approximately 3 mm from the perimeters of wafers centered on the vertical axis.

4. A boat for supporting a plurality of semiconductor wafers, all of the same radius R, in a vertical stack for processing, where R equals one and only one of either 100 millimeters (mm), 150 mm, or 225 mm, the boat comprising:
a plurality of vertical support members spaced around a vertical axis and each having a plurality of vertically spaced slots therein each horizontally aligned with a slot in each of the other vertical support members;
each slot having an upwardly facing surface therein having a recessed wafer supporting area thereon recessed below the upwardly facing surface and forming an inwardly facing vertical step in the upwardly facing surface, the vertical steps each facing the vertical axis and being spaced at least a distance R+1 mm from the vertical axis, wherein the steps are sufficiently close to the vertical axis to be effective to constrain wafers having a radius R supported on the recessed wafer supporting areas from sliding off of a wafer supporting area within one of the horizontally aligned slots in one of the other vertical support members;
the plurality of vertical support members including at least three vertical support members spaced around the vertical axis and having the slots therein on a side thereof generally facing the vertical axis;
the boat having a front side from which wafers are loaded into the boat and a back side;
each slot having a depth measured from the vertical axis of approximately R+5 mm or more;
adjacent vertical support members being spaced less than 180 degrees apart around the vertical axis, at least one of the vertical support members being spaced rearward of the vertical axis toward the back side of the boat, and two adjacent ones of the vertical support members being spaced forward of the vertical axis toward the front side of the boat such that the horizontally aligned slots in said two adjacent ones of the vertical support members provide horizontal clearance therebetween of at least 2R+4 mm for insertion and removal of the wafers therebetween; and the recessed wafer supporting area on each of the upwardly facing surfaces is recessed approximately 0.5 mm below the upwardly facing surface and the inwardly facing vertical step in said upwardly facing surface extends inward from the vertical axis approximately R+1 mm, whereby each inwardly facing step is spaced approximately 1 mm from the edge of a wafer that is supported on the recessed area in said upwardly facing surface and is centered on the vertical axis.

5. The boat of claim 4 wherein:

the inwardly facing steps of horizontally aligned slots on said two adjacent ones of the vertical support members are spaced apart by a distance of less than 2R.

6. The boat of claim 5 wherein:

said two adjacent vertical support members are spaced about 150 to 160 degrees apart.

7. The boat of claim 4 wherein:

said two adjacent vertical support members are spaced about 150 to 160 degrees apart.

8. The boat of claim 4 further comprising:

a processing chamber enclosing said boat;

a wafer transfer mechanism coupled to said processing chamber and moveable to transfer each of a plurality of wafers into said chamber and onto said boat by inserting each wafer between said two forward vertical support members in horizontal alignment with one of said slots above the upwardly facing surfaces thereof, centering the wafer on the vertical axis, then lowering the wafer below the upwardly facing surfaces thereof onto the recessed wafer supporting areas.

9. The boat of claim 8 wherein:

the processing chamber is configured for subjecting the wafers on the boat to a carbon process.

10. The boat of 8 wherein:

the forward vertical support members are spaced from about 150 to about 160 degrees apart.

11. The boat of claim 4 further comprising:

a processing chamber enclosing said boat and configured to perform a carbon process on wafers therein supported on said boat.

* * * * *

UNITED STATES PATENT AND TRADEMARK OFFICE
CERTIFICATE OF CORRECTION

PATENT NO. : 7,661,544 B2  Page 1 of 1
APPLICATION NO. : 11/670111
DATED : February 16, 2010
INVENTOR(S) : Frank Herzog It is certified that error appears in the above-identified patent and that said Letters Patent is hereby corrected as shown below:

In Claim 10, at column 8, line 15, "The boat of 8 wherein:" should read --The boat of claim 8 wherein:--.

Signed and Sealed this

Fifth Day of October, 2010

David J. Kappos
*Director of the United States Patent and Trademark Office*